(12) United States Patent
Yoo

(10) Patent No.: US 9,337,179 B2
(45) Date of Patent: May 10, 2016

(54) ELECTROSTATIC DISCHARGE PROTECTION CIRCUIT

(71) Applicant: SAMSUNG ELECTRONICS CO., LTD., Suwon-Si, Gyeonggi-Do (KR)

(72) Inventor: Jae-Hyun Yoo, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/674,559

(22) Filed: Mar. 31, 2015

(65) Prior Publication Data

US 2016/0071832 A1  Mar. 10, 2016

(30) Foreign Application Priority Data

Sep. 4, 2014  (KR) .................. 10-2014-0117795

(51) Int. Cl.
*H01L 27/082* (2006.01)
*H01L 29/06* (2006.01)
*H01L 21/331* (2006.01)
*H01L 27/02* (2006.01)
*H01L 27/06* (2006.01)
*H01L 29/866* (2006.01)
*H01L 29/735* (2006.01)
*H01L 29/732* (2006.01)
*H01L 29/10* (2006.01)
*H01L 29/08* (2006.01)

(52) U.S. Cl.
CPC .......... *H01L 27/0255* (2013.01); *H01L 27/067* (2013.01); *H01L 29/0804* (2013.01); *H01L 29/0821* (2013.01); *H01L 29/1004* (2013.01); *H01L 29/732* (2013.01); *H01L 29/735* (2013.01); *H01L 29/866* (2013.01)

(58) Field of Classification Search
CPC .............. H01L 27/0255; H01L 27/067; H01L 29/0804; H01L 29/0821; H01L 29/866; H01L 29/1004; H01L 29/735; H01L 29/732
USPC .......... 257/303, 355, 503, 565, 577, E29.007, 257/E29.255, E27.056, E27.06, E21.37, 257/E21.544; 438/297, 328, 414
See application file for complete search history.

(56) References Cited

U.S. PATENT DOCUMENTS

| | | | |
|---|---|---|---|
| 6,459,139 | B2 | 10/2002 | Watanabe et al. |
| 6,653,689 | B2 | 11/2003 | Okawa |
| 6,831,334 | B2 | 12/2004 | Okawa et al. |
| 7,026,705 | B2 | 4/2006 | Yamamoto et al. |
| 8,018,001 | B2 | 9/2011 | Otake |
| 8,218,276 | B2 | 7/2012 | Mallikarjunaswamy |

(Continued)

FOREIGN PATENT DOCUMENTS

| | | |
|---|---|---|
| JP | 3348711 | 9/2002 |
| KR | 19970018498 | 4/1997 |

(Continued)

*Primary Examiner* — Dao H Nguyen
(74) *Attorney, Agent, or Firm* — Volentine & Whitt, PLLC

(57) ABSTRACT

An electrostatic discharge (ESD) protection circuit includes a substrate, a semiconductor layer provided on the substrate to have a first conductivity type, a first well provided in a first region of the semiconductor layer to have a second conductivity type, an insulating pattern provided in the first well to cross the first well, and first and second doped regions provided in an upper portion of the first well to have the first conductivity type. The first and second doped regions may be laterally spaced apart from each other with the insulating pattern interposed therebetween.

19 Claims, 15 Drawing Sheets

(56) References Cited

U.S. PATENT DOCUMENTS

| | | |
|---|---|---|
| 8,242,566 B2 | 8/2012 | Zhan et al. |
| 8,252,656 B2 | 8/2012 | Whitfield et al. |
| 8,531,005 B2 | 9/2013 | Whitfield et al. |
| 2001/0016380 A1 | 8/2001 | Watanabe et al. |
| 2004/0026728 A1* | 2/2004 | Yoshida ............ H01L 29/7801 257/303 |
| 2005/0167753 A1* | 8/2005 | Mallikarjunaswamy ................ H01L 27/0259 257/360 |
| 2009/0026578 A1 | 1/2009 | Wu et al. |
| 2012/0133025 A1* | 5/2012 | Clarke ................ H01L 29/735 257/570 |
| 2014/0054707 A1* | 2/2014 | Jou .................... H01L 27/0259 257/355 |
| 2014/0197491 A1* | 7/2014 | Yamaji ................ H01L 21/266 257/355 |

FOREIGN PATENT DOCUMENTS

| | | |
|---|---|---|
| KR | 19990051369 | 7/1999 |
| KR | 20010019288 | 3/2001 |

\* cited by examiner

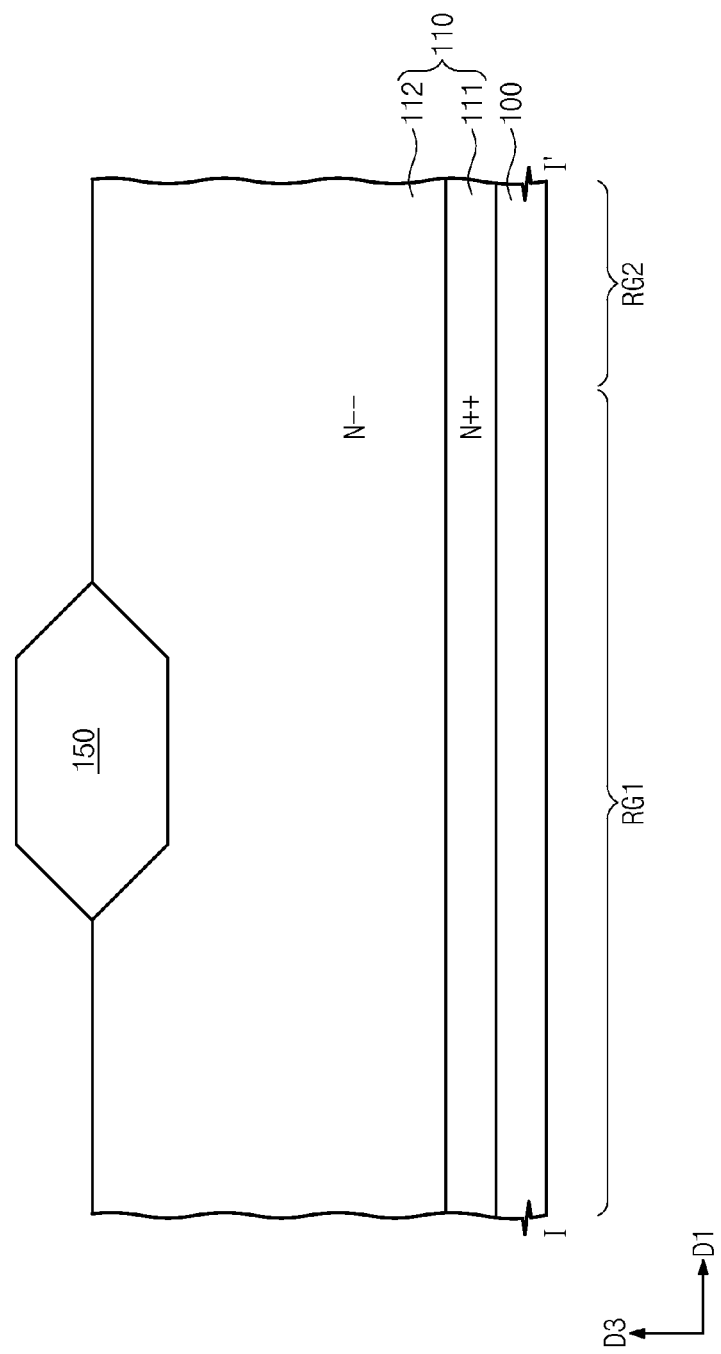

ELECTROSTATIC DISCHARGE PROTECTION CIRCUIT

CROSS-REFERENCE TO RELATED APPLICATIONS

A claim of priority under 35 U.S.C. §119 is made to Korean Patent Application No. 10-2014-0117795, filed on Sep. 4, 2014, in the Korean Intellectual Property Office, the entire contents of which are herein incorporated by reference in their entirety.

BACKGROUND

Example embodiments of the inventive concept generally relate to electrostatic discharge, and in particular, to an electrostatic discharge protection circuit.

A semiconductor integrated circuit is highly sensitive to an electrostatic discharge (ESD) pulse. That is, the high voltage and large current attendant an ESD pulse can physically damage the semiconductor integrated circuit. Further, as integration densities of semiconductor devices increase, the voltage and current levels capable of causing damage decrease. As such, in an effort to prevent ESD damage of a semiconductor device, an ESD protection circuit may be connected to an input/output terminal of the semiconductor device.

When an ESD pulse is applied to a semiconductor device, the ESD protection circuit is generally configured to quickly discharge the ESD pulse to the outside of a semiconductor device. In general, a bipolar transistor or a diode is implemented as the ESD protection circuit. In some cases, a grounded gate NMOS transistor is implemented for the ESD protection circuit.

SUMMARY

According to example embodiments of the inventive concept, an electrostatic discharge (ESD) protection circuit may include a substrate, a semiconductor layer covering a top surface of the substrate and having a first conductivity type, a first well in a first region of the semiconductor layer, the first well having a second conductivity type different from the first conductivity type and extending downwardly from a top surface of the semiconductor layer, an insulating pattern crossing the first well on the first well, and a first doped region and a second doped region provided in an upper portion of the first well, the first and second doped regions having the first conductivity type. The first and second doped regions may be laterally spaced apart from each other with the insulating pattern interposed therebetween.

In example embodiments, the first doped region, the first well, and the semiconductor layer may be vertically-stacked to form a vertical bipolar transistor.

In example embodiments, the first well and the second doped region may contact with each other to form a Zener diode, and the first doped region, the first well, and the second doped region may make junctions to form a lateral bipolar transistor.

In example embodiments, the first well may serve as a common base of the vertical and lateral bipolar transistors, and the first doped region may serve as a common emitter of the vertical and lateral bipolar transistors.

In example embodiments, the semiconductor layer may serve as a first collector of the vertical bipolar transistor, the second doped region may serve as a second collector of the lateral bipolar transistor, and the first and second collectors may be connected in common to an external pad.

In example embodiments, the ESD protection circuit may further include a third doped region between the first well and the first surface. The third doped region having the first conductivity type may contact with the first well, and when viewed in plan view, the first and third doped regions may be overlapped with each other.

In example embodiments, the first doped region, the first well, and the third doped region may make junctions to form a vertical bipolar transistor.

In example embodiments, the ESD protection circuit may further include a second well extending downwardly from a bottom surface of the first well. The second well may have the second conductivity type and may have a doping concentration lower than that of the first well.

In example embodiments, the ESD protection circuit may further include a doped plug provided in a second region of the semiconductor layer and extended downwardly from the top surface of the semiconductor layer, the doped plug having the first conductivity type, and a fourth doped region provided in an upper portion of the doped plug, the fourth doped region having the first conductivity type.

In example embodiments, the doped plug may be laterally spaced apart from the first well.

In example embodiments, the ESD protection circuit may further include a doped plug provided in a second region of the semiconductor layer and extended downwardly from the top surface of the semiconductor layer, the doped plug having the first conductivity type. The second doped region may be laterally extended into an upper portion of the doped plug.

In example embodiments, the ESD protection circuit may further include a fifth doped region between the first doped region and the insulating pattern. The fifth doped region may have the second conductivity type, and the first well and the second doped region contact with each other to form a Zener diode discharging holes to an outside through the fifth doped region.

In example embodiments, the ESD protection circuit may further include a lightly-doped region between the second doped region and the insulating pattern. The lightly-doped region may have the first conductivity type, and a bottom surface of the lightly-doped region may be lower than that of the second doped region.

In example embodiments, when viewed in plan view, the insulating pattern may be provided to form a polygonal closed curve with four or more vertices, the first doped region may be disposed at a center of an inner region defined by the insulating pattern, and the second doped region may be disposed outside the insulating pattern.

According to example embodiments of the inventive concept, an ESD protection circuit may include a substrate, a semiconductor layer having a first conductivity type on the substrate, a first well in a first region of the semiconductor layer, the first well having a second conductivity type different from the first conductivity type and extending downwardly from a top surface of the semiconductor layer, an insulating pattern crossing the first well on the first well, a first doped region and a second doped region in an upper portion of the first well, the first and second doped regions having the first conductivity type and being laterally spaced apart from each other with the insulating pattern interposed therebetween, a third doped region spaced apart from the insulating pattern with the first doped region therebetween, and a fourth doped region interposed between the first doped region and the insulating pattern. Here, the third and fourth doped regions may have the second conductivity type, and the first well and the second doped region may contact with each other to form a Zener diode capable of discharging holes through the third doped region.

In example embodiments, the ESD protection circuit may further include a third well laterally spaced apart from the first well to have the second conductivity type and a second well having the second conductivity type extended downwardly from bottom surfaces of the first and third wells. Here, the first well may make a junction with the fourth doped region, the second well make a junction with the first doped region, and the third well make a junction with the third doped region. The first and third wells may have doping concentrations higher than that of the second well.

In example embodiments, the semiconductor layer may include a buried layer of the first conductivity type and an epitaxial layer having the second conductivity type on the buried layer. Here, the first doped region, the epitaxial layer, and the buried layer may be vertically-stacked to form a vertical bipolar transistor.

According to example embodiments of the inventive concept, an electrostatic discharge (ESD) protection circuit may include a Zener diode, a lateral bipolar transistor having a first collector, and a vertical bipolar transistor having a second collector, an emitter and a base of the lateral bipolar transistor may be used as those of the vertical bipolar transistor and have different conductivity types from each other, the first collector of the lateral bipolar transistor and the second collector of the vertical bipolar transistor have the same conductivity type as the emitter of the lateral bipolar transistor, and the first collector and the base of the lateral bipolar transistor may constitute the Zener diode.

In example embodiments, the emitter of the lateral bipolar transistor may be electrically connected to a ground terminal applied with a ground voltage, the first and second collectors of the lateral and vertical bipolar transistors may be connected in common to a pad serving as an input/output terminal.

In example embodiments, the Zener diode may be configured to turn on the lateral and vertical bipolar transistors, when an ESD event occurs, and the first well may be electrically connected to a first terminal, to which a ground voltage may be applied.

BRIEF DESCRIPTION OF THE DRAWINGS

Example embodiments will be more clearly understood from the detail description that follows, with reference to the accompanying drawings. The accompanying drawings represent non-limiting, example embodiments as described herein.

FIGS. 5A through 5C are sectional views for reference in describing a method of fabricating an ESD circuit according to example embodiments of the inventive concept, taken along line I-I' of FIG. 3.

Figure 1:
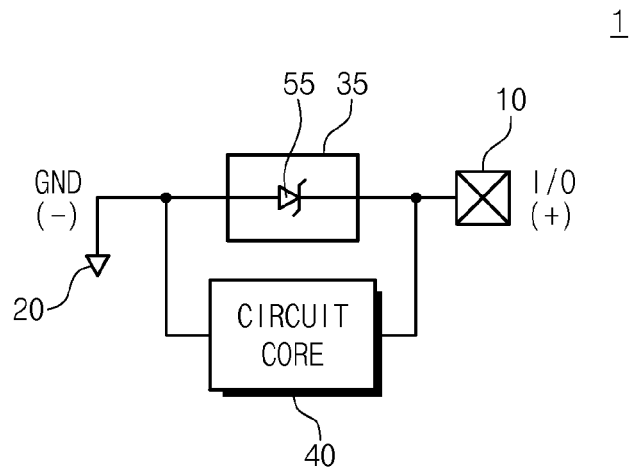
FIG. 1 is a schematic circuit diagram of a semiconductor device having a conventional electrostatic discharge protection (ESD) circuit.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic circuit diagram of a semiconductor device including a conventional electrostatic discharge protection (ESD) circuit 35.

Referring to FIG. 1, a semiconductor device 1 includes an ESD circuit 35. The ESD circuit 35 may be provided between a pad 10 serving as an input/output (I/O) terminal and a ground terminal 20 to which a ground voltage is applied. The ESD circuit 35 may be configured to protect other circuits in the semiconductor device 1 against an electrostatic discharge pulse. For example, the ESD circuit 35 may be configured to protect a core circuit part 40, which is connected to the pad 10 and the ground terminal 20, against the electrostatic discharge pulse. The core circuit part 40 may include various devices and circuits including electric components.

The ESD circuit 35 includes a Zener diode 55. In the case where a potential difference higher than a Zener breakdown voltage is produced between the pad 10 and the ground terminal 20 by static electricity, the Zener diode 55 allows the current to be quickly discharged.

Figure 2:
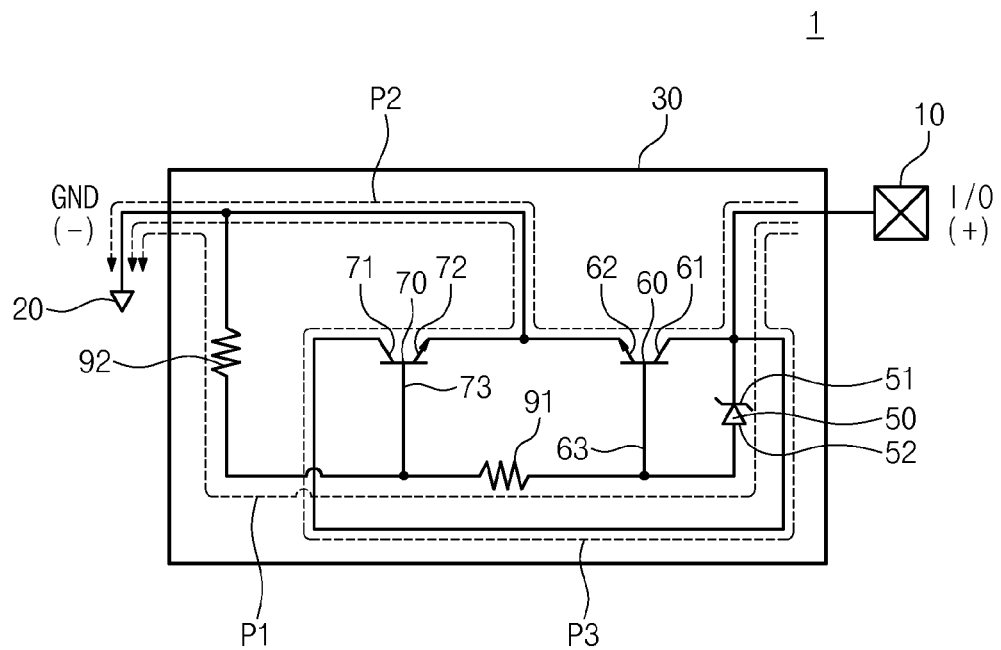
FIG. 2 is a schematic circuit diagram of a semiconductor device including an ESD circuit according to example embodiments of the inventive concept.

FIG. 2 is a schematic circuit diagram of a semiconductor device including an ESD circuit 30 according to example embodiments of the inventive concept.

The ESD circuit 30 of FIG. 2 may be connected in the same manner as the ESD circuit 35 of FIG. 1. That is, according to example embodiments of the inventive concept, as shown in FIG. 2, the ESD circuit 30 may be provided between the pad 10 serving as the input/output (I/O) terminal and the ground terminal 20 to which the ground voltage is applied, and parallel to the circuit core 40 (FIG. 1). As also shown in FIG. 2, the ESD circuit 30 may include a lateral bipolar transistor 60, a vertical bipolar transistor 70, and a Zener diode 50.

The Zener diode 50 may include a cathode 51 and an anode 52. A first resistor 91 and a second resistor 92 may be provided between the Zener diode 50 and the ground terminal 20. The lateral bipolar transistor 60 may include a first collector 61, a first emitter 62, and a first base 63. The vertical bipolar transistor 70 may include a second collector 71, a second emitter 72, and a second base 73. The first and second bases 63 and 73 may be used as a common base for the lateral and vertical bipolar transistors 60 and 70. Furthermore, the first and second emitters 62 and 72 may be used as a common emitter for the lateral and vertical bipolar transistors 60 and 70.

In the case where a potential difference higher than a predetermined Zener breakdown voltage is produced between the pad 10 and the ground terminal 20 by static electricity, a current may flow through a first current path P1 including the Zener diode 50 and may be discharged to the ground terminal 20. For example, the current may flow through the first current path P1 including the pad 10, the cathode 51, the anode 52, the first resistor 91, the second resistor 92, and the ground terminal 20.

In addition, the lateral and vertical bipolar transistors 60 and 70 may be turned on by a difference in electric potential between the first emitter 62 and the first base 63 and between the second emitter 72 and the second base 73. Accordingly, a part of the current may be discharged to the ground terminal 20 through a second current path P2 including the lateral bipolar transistor 60, and another part of the current may be discharged to the ground terminal 20 through a third current path P3 including the vertical bipolar transistor 70. For example, the second current path P2 may consist of the pad 10, the first collector 61, the first emitter 62, and the ground terminal 20, and the third current path P3 may consist of the pad 10, the second collector 71, the second emitter 72, and the ground terminal 20.

The usage of the ESD circuit 30 according to the present embodiment makes it possible to quickly decrease a voltage applied to the core circuit part 40. As an example, the ESD circuit 30 may be a low voltage ESD circuit, whose breakdown voltage ranges from 5V to 7V. In other words, by using the ESD circuit 30, it is possible to prevent a voltage higher than 5V to 7V from being applied to the core circuit part 40.

Figure 3:
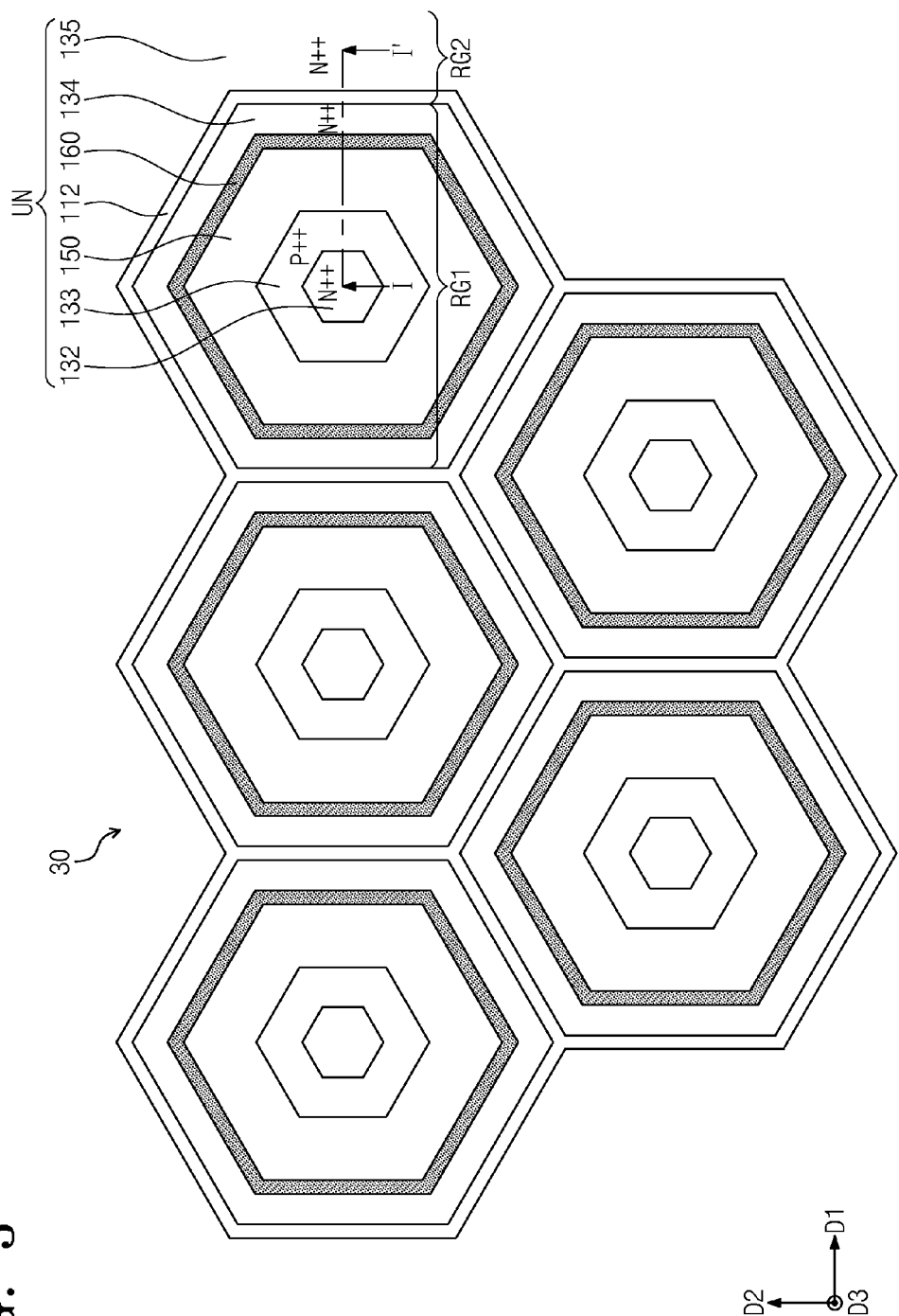
FIG. 3 is a plan view illustrating an ESD circuit according to example embodiments of the inventive concept.
Figure 4:
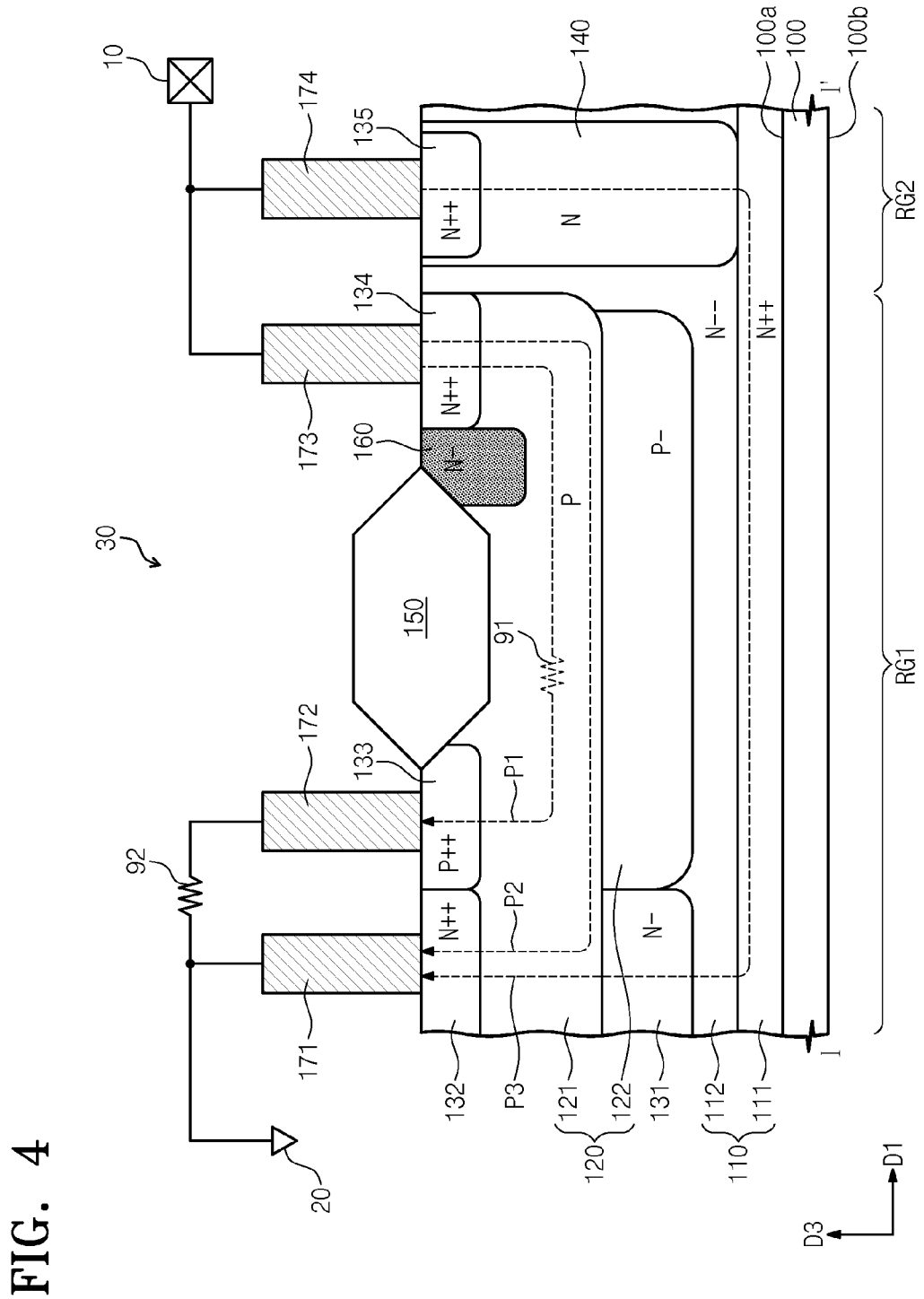
FIG. 4 is a sectional view taken along line I-I' of FIG. 3.

FIG. 3 is a plan view illustrating an ESD circuit according to example embodiments of the inventive concept, and FIG. 4 is a sectional view taken along line I-I' of FIG. 3.

Referring to FIGS. 2, 3, and 4, the ESD circuit 30 may include a plurality of units UN. One or each of the units UN may include a first region RG1 at a central region thereof and a second region RG2 adjacent to the first region RG1. Hereinafter, the ESD circuit 30 will be described with reference to one of the units UN.

A substrate 100 having first and second surfaces 100a and 100b facing each other may be provided. The substrate 100 may include the first region RG1 and the second region RG2. In example embodiments, the substrate 100 may be a silicon wafer, a germanium wafer, or a silicon-germanium wafer.

A semiconductor layer 110 may be provided on the first surface 100a of the substrate 100. The semiconductor layer 110 may include a buried layer 111 and an epitaxial layer 112, which are sequentially stacked on the semiconductor layer 110 to cover the first surface 100a. Here, the epitaxial layer 112 may be a layer, which is grown from the buried layer 111 in a third direction D3 perpendicular to the first surface 100a. The buried layer 111 may be heavily doped to have a first conductivity type. As an example, the buried layer 111 may be an n++ layer, whose impurity concentration is higher than that of doped regions 131-135 to be formed in a subsequent process. The epitaxial layer 112 may be lightly doped to have the first conductivity type. As an example, the epitaxial layer 112 may be an n-- layer, whose impurity concentration is lower than that of the doped regions 131-135. The buried layer 111 and the epitaxial layer 112 may be silicon layers.

Wells 120 may be formed in the first region RG1 of the epitaxial layer 112. The wells 120 may include a first well 121 extending from a top surface of the epitaxial layer 112 in the third direction D3 and a second well 122 extending from a bottom surface of the first well 121 toward the first surface 100a. When viewed in plan view, the first well 121 may have a hexagonal shape, and the second well 122 may have a hollow hexagonal shape. For example, the second well 122 may be shaped like a doughnut. The first and second wells 121 and 122 may have bottom surfaces, which are spaced apart from a bottom surface of the epitaxial layer 112 in the third direction D3. The first well 121 may be doped to have a second conductivity type, and the second well 122 may be lightly doped to have the second conductivity type. For example, the first well 121 may be of a p type, and the second well 122 may be of a p– type. In other words, a doping concentration of the second well 122 may be lower than that of the first well 121.

The first doped region 131 may be disposed between the first well 121 and the first surface 100a of the substrate 100. For example, a top surface of the first doped region 131 may make a junction with the bottom surface of the first well 121, and a bottom surface of the first doped region 131 may be spaced apart from the bottom surface of the epitaxial layer 112 in the third direction D3. The bottom surface of the first doped region 131 may be coplanar with a bottom surface of the second well 122, but example embodiments of the inventive concept may not be limited thereto. When viewed in a plan view, the first doped region 131 may have a hexagonal shape. Further, a side surface of the first doped region 131 may be in contact with an inner side surface of the second well 122. As another example, although not shown, the side surface of the first doped region 131 may be spaced apart from the inner side surface of the second well 122.

The first doped region 131 may be lightly doped to have the first conductivity type. As an example, the first doped region 131 may be of an n– type. In other example embodiments, although not shown, the first doped region 131 may not be formed, and the bottom surface of the first well 121 may be in direct contact with the epitaxial layer 112.

A doped plug 140 may be provided in the second region RG2 of the epitaxial layer 112. The doped plug 140 may extend from the top surface of the epitaxial layer 112 to the first surface 100a. A bottom surface of the doped plug 140 may be in contact with a top surface of the buried layer 111. The doped plug 140 may be provided spaced apart from both the first well 121 and the second well 122 in a lateral direction. The doped plug 140 may be doped to have the first conductivity type. As an example, the doped plug 140 may be of an n type.

An insulating pattern 150 may be provided on the first well 121. The insulating pattern 150 may be formed in a recessed region defined by the top surface of the epitaxial layer 112 to cross the first well 121. The insulating pattern 150 may have a bottom surface that is spaced apart from the bottom surface of the first well 121 in the third direction D3. When viewed in a plan view, the insulating pattern 150 may have a hollow hexagonal shape. In other words, the insulating pattern 150 may be shaped like a closed polygonal curve (e.g., a polygonal doughnut-shaped structure). The insulating pattern 150 may be a field oxide structure including a silicon oxide layer. Alternatively, although not shown, the insulating pattern 150 may be formed using a shallow trench isolation (STI) technology and may include a silicon oxide layer.

A second doped region 132, a third doped region 133, and a fourth doped region 134 may be provided in an upper portion of the first well 121. The second to fourth doped regions 132, 133, and 134 may be formed to have bottom surfaces spaced apart from the bottom surface of the first well 121 in the third direction D3. The fourth doped region 134 may be formed spaced apart from the second and third doped regions 132 and 133 by the insulating pattern 150 in a horizontal direction.

When viewed in plan view, the second doped region 132 may be disposed at a center of an inner region, which is defined by the insulating pattern 150 shaped like a closed curve, and may have a hexagonal shape. The third doped region 133 may be disposed between the second doped region 132 and the insulating pattern 150. For example, the third doped region 133 may be shaped like a doughnut enclosing the second doped region 132. A side surface of the second doped region 132 may be in contact with an inner side surface of the third doped region 133. The fourth doped region 134 may be disposed outside the insulating pattern 150 shaped like a closed curve. For example, the fourth doped region 134 may be shaped like a doughnut enclosing the insulating pattern 150. The first doped region 131 and the second doped region 132 may be spaced apart from each other in the third direction D3, but when viewed in plan view, the first doped region 131 and the second doped region 132 may be overlapped with each other.

The second and fourth doped regions 132 and 134 may be heavily doped to have the first conductivity type. The third doped region 133 may be heavily doped to have the second conductivity type. As an example, the second and fourth doped regions 132 and 134 may be n++ regions, and the third doped region 133 may be a p++ region. The second to fourth doped regions 132, 133, and 134 may be formed to have doping concentrations higher than that of the buried layer 111.

A lightly-doped region 160 may be interposed between the fourth doped region 134 and the insulating pattern 150. The lightly-doped region 160 may be formed to have a bottom surface lower than that of the fourth doped region 134. For example, the bottom surface of the lightly-doped region 160 may be positioned between bottom surfaces of the fourth doped region 134 and the first well 121. When viewed in plan view, the lightly-doped region 160 may be shaped like a doughnut enclosing the insulating pattern 150. The lightly-doped region 160 may be lightly doped to have the first conductivity type. As an example, the lightly-doped region 160 may be an n− region.

Figure 7:
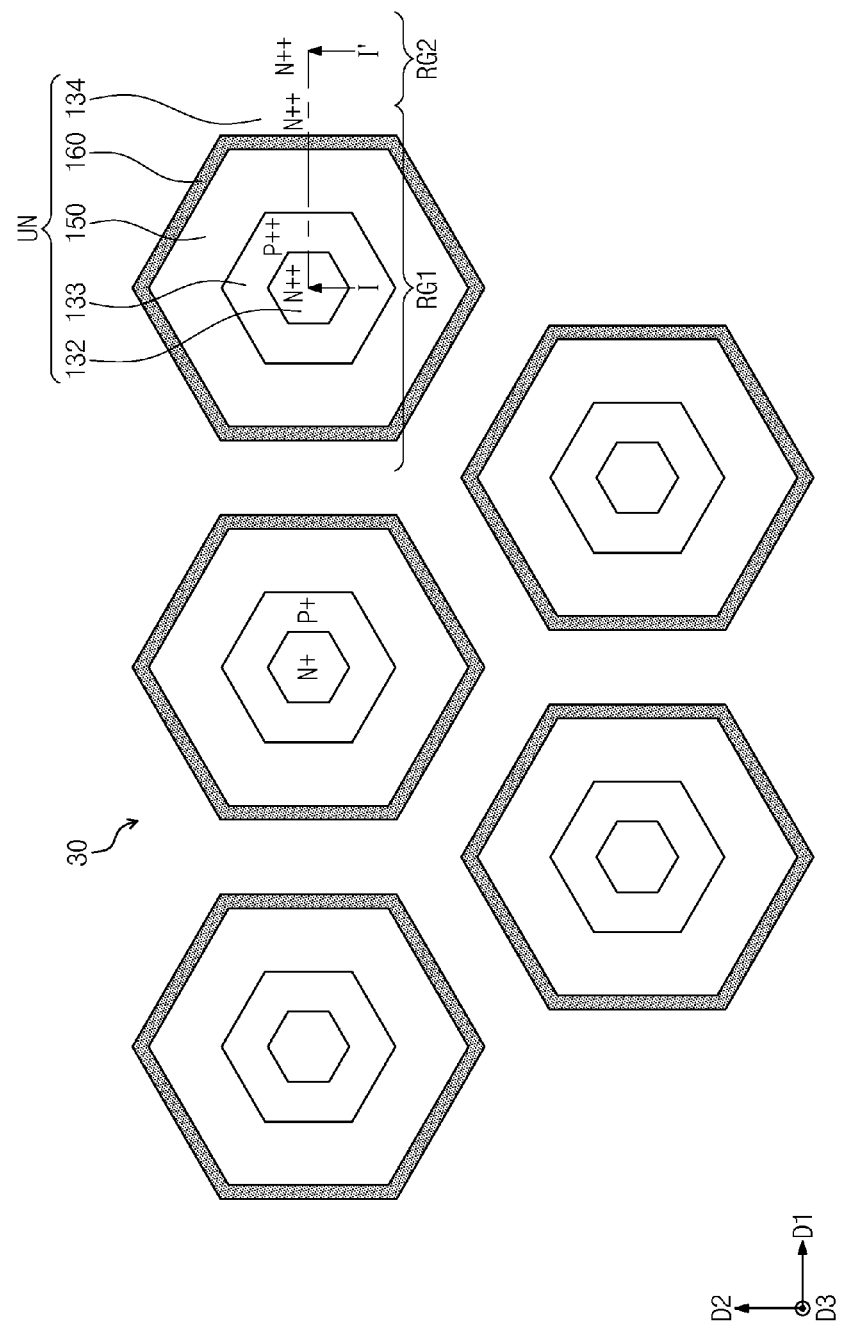
FIG. 7 is a plan view illustrating an ESD circuit according to still other example embodiments of the inventive concept.
Figure 8:
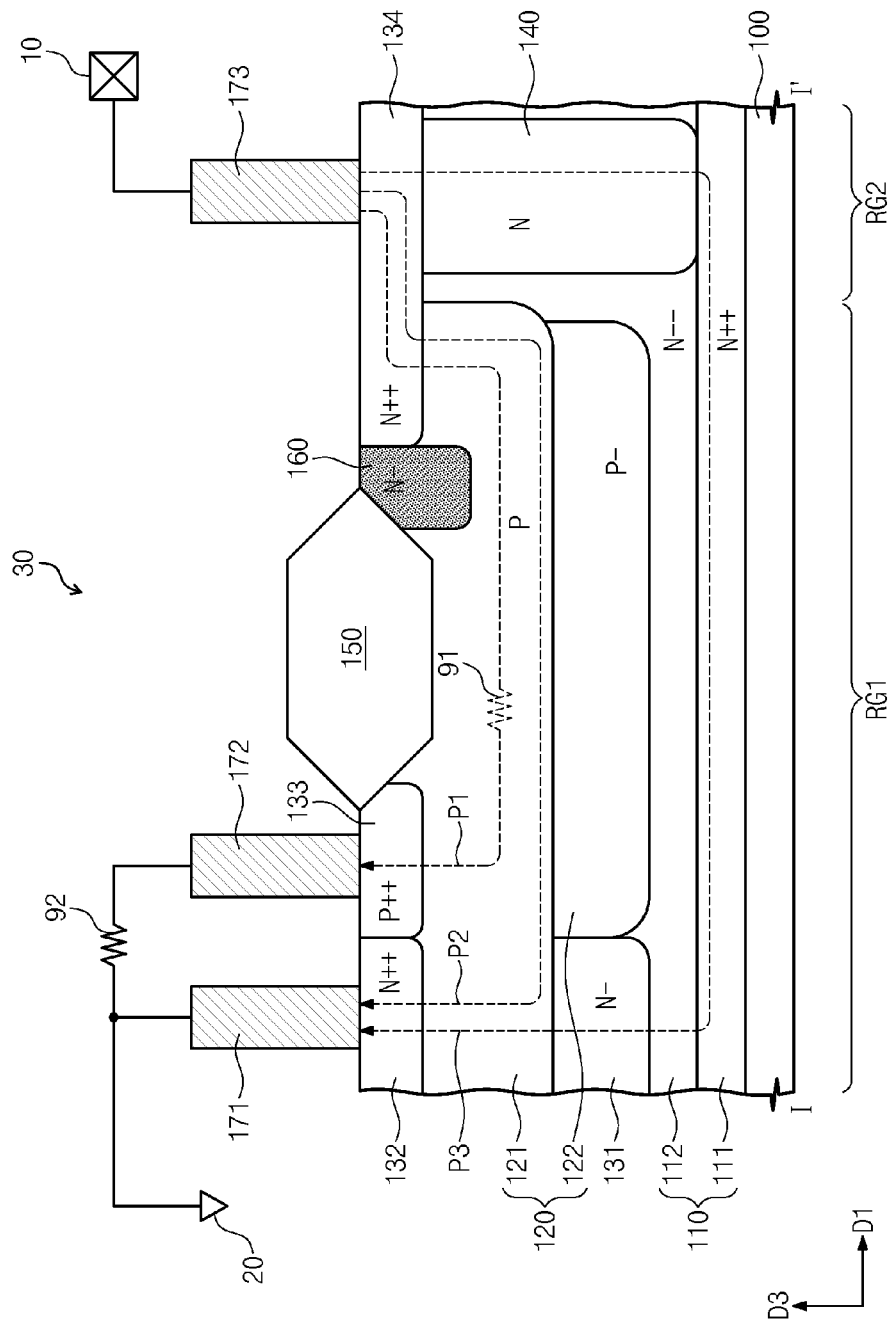
FIG. 8 is a sectional view taken along line I-I' of FIG. 7.

The fifth doped region 135 may be formed in an upper portion of the doped plug 140. The fifth doped region 135 may be heavily doped to have the first conductivity type. As an example, the fifth doped region 135 may be an n++ region. For example, the fifth doped region 135 may be formed to have a doping concentration higher than that of the buried layer 111. In certain embodiments, the fifth doped region 135 may be omitted, as shown in FIGS. 7 and 8.

First to fourth contacts 171-174 may be connected to top surfaces of the second to fifth doped regions 132, 133, 134, and 135, respectively. The first contact 171 on the second doped region 132 and the second contact 172 on the third doped region 133 may be connected to the ground terminal 20, and the third contact 173 on the fourth doped region 134 and the fourth contact 174 on the fifth doped region 135 may be connected to the pad 10. The second resistor 92 may be disposed between the ground terminal 20 and the second contact 172, as shown in FIG. 2.

The first well 121 and the fourth doped region 134 may make a junction with each other, thereby forming the Zener diode 50. Here, the fourth doped region 134 may serve as the cathode 51 of the Zener diode 50, and the third doped region 133 may make a junction with the first well 121, thereby serving as the anode 52 of the Zener diode 50. If a potential difference between the pad 10 and the ground terminal 20 is increased by an ESD event, the Zener diode 50 may be operated to discharge holes to the ground terminal 20 through the fourth doped region 134, the first well 121 and the third doped region 133. In other words, the first current path P1 can be formed. Here, a parasitic resistor, i.e., the first resistor 91, may be formed on the first current path P1 including the Zener diode 50.

The lightly-doped region 160 may contribute to prevent the holes from flowing through an upper portion of the first well 121. In other words, by virtue of the presence of the lightly-doped region 160, the first current path P1 can be formed in a lower portion of the first well 121. By contrast, in the case where the first current path P1 is formed in the upper portion of the first well 121, hot spots may occur at an interface between the insulating pattern 150 and the fourth doped region 134. However, according to example embodiments of the inventive concept, such a formation of the hot spot can be prevented by the lightly-doped region 160.

The second doped region 132, the first well 121, and the fourth doped region 134 may make junctions with one another, thereby forming the lateral bipolar transistor 60. The lateral bipolar transistor 60 may be an NPN junction bipolar transistor. Here, the second doped region 132 may serve as the first emitter 62 of the lateral bipolar transistor 60, the first well 121 may serve as the first base 63 of the lateral bipolar transistor 60, and the fourth doped region 134 may serve as the first collector 61 of the lateral bipolar transistor 60. If the Zener diode 50 is operated, a potential difference between the second doped region 132 and the first well 121 may be increased to cause a turn-on of the lateral bipolar transistor 60. Accordingly, electrons may be discharged to the pad 10 through the second doped region 132, the first well 121, and the fourth doped region 134. In other words, the second current path P2 can be formed.

The second doped region 132, the first well 121, and the first doped region 131 may make junctions with one another, thereby forming the vertical bipolar transistor 70. The vertical bipolar transistor 70 may be an NPN junction bipolar transistor. Here, the second doped region 132 may serve as the second emitter 72 of the vertical bipolar transistor 70, the first well 121 may serve as the second base 73 of the vertical bipolar transistor 70, and the first doped region 131 may serve as the second collector 71 of the vertical bipolar transistor 70. Although not shown, if the first doped region 131 is omitted, the epitaxial layer 112 may serve as the second collector 71 of the vertical bipolar transistor 70. In addition, the second doped region 132 may serve as a common emitter of the lateral and vertical bipolar transistors 60 and 70, and the first well 121 may serve as a common base of the lateral and vertical bipolar transistors 60 and 70. If the Zener diode 50 is operated, a potential difference between the second doped region 132 and the first well 121 may be increased to cause a turn-on of the vertical bipolar transistor 70. Accordingly, electrons can be discharged to the pad 10 through the second doped region 132, the first well 121, the first doped region 131, the epitaxial layer 112, the buried layer 111, the doped plug 140, and the fifth doped region 135. In other words, the third current path P3 can be formed.

Since, as previously described with reference to FIG. 2, the lateral and vertical bipolar transistors 60 and 70 include the second doped region 132 serving as the common emitter thereof and the first well 121 serving as the common base thereof, the lateral and vertical bipolar transistors 60 and 70 can be turned on by the operation of the Zener diode 50 at substantially the same time.

Further, by adjusting process parameters (e.g., the doping concentration of the first well 121 serving as the common base), it is also possible to turn on the lateral bipolar transistor 60 and the vertical bipolar transistor 70 in a sequential manner.

The second resistor 92, which is provided between the common emitter (i.e., the second doped region 132) and the common base (i.e., the first well 121), may make it possible to finely control operations of the Zener diode 50 and the lateral and vertical bipolar transistors 60 and 70. For example, by changing electric resistance of the second resistor 92, the lateral and vertical bipolar transistors 60 and 70 can be turned on in advance before the operation of the Zener diode 50.

In the present embodiment, the ESD circuit 30 may be configured to have the first to third current paths P1, P2, and P3, and thus, the ESD circuit 30 makes it possible to quickly remove an electrostatic discharge pulse. In other words, when an ESD event occurs, it is possible to quickly lower a voltage of the core circuit part 40.

Further, when viewed in plan view, the second and third doped regions 132 and 133 serving as the anode 52 may have a hexagonal shape and the fourth doped region 134 serving as the cathode 51 may enclose the second and third doped regions 132 and 133 with the insulating pattern 150 intervening therebetween. Accordingly, the unit UN provides an ability to discharge a higher current density. Although, in the present embodiment, the second and third doped regions 132 and 133 are described to have a hexagonal shape, the inventive concept is not limited thereto. For example, the second and third doped regions 132 and 133 may have a tetragonal shape as in other example embodiments to be described below or any polygonal shape.

Figure 5A:
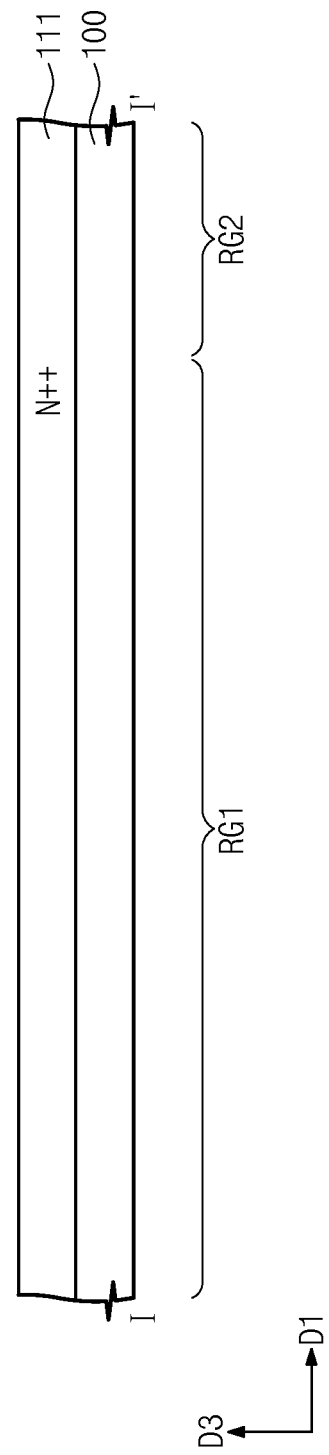
Figure 5C:
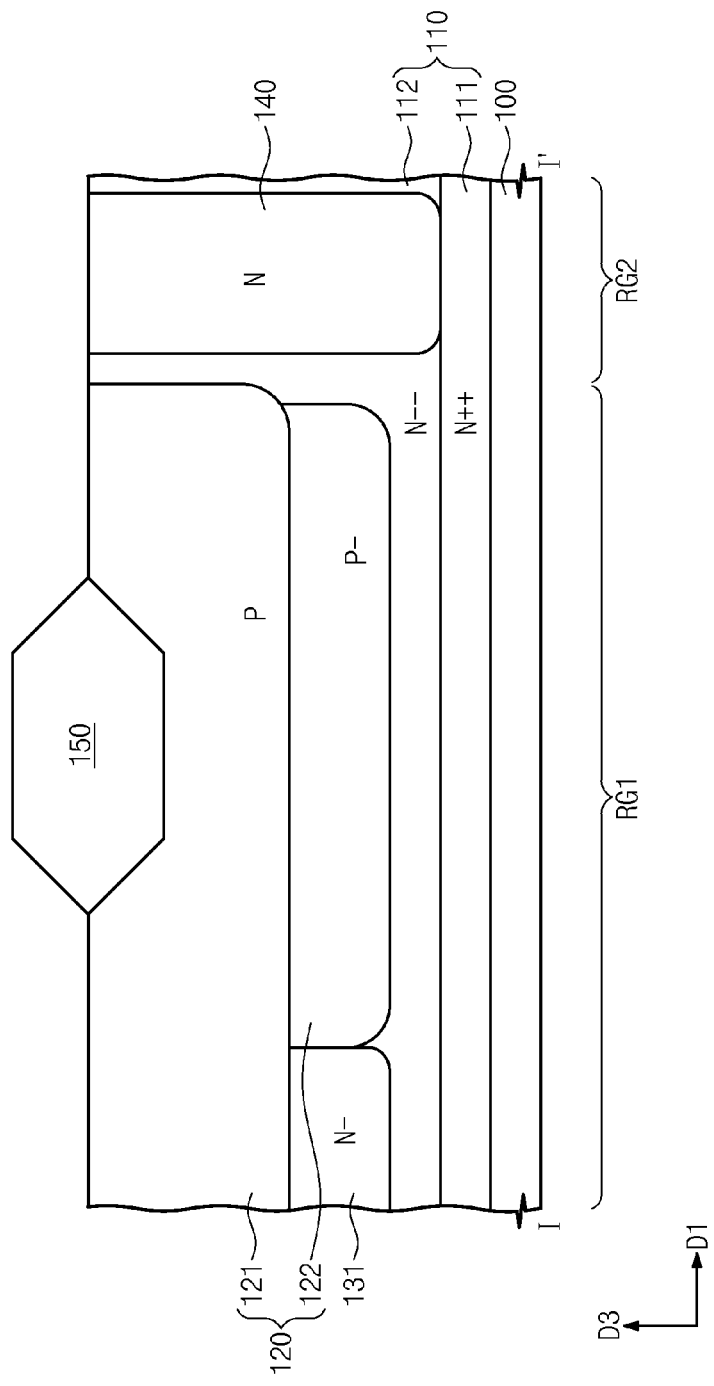

FIGS. 5A through 5C are sectional views illustrating a method of fabricating an ESD circuit according to example embodiments of the inventive concept, taken along line I-I' of FIG. 3. Similar to the manner previously described with reference to FIGS. 2, 3, and 4, a method of fabricating the ESD circuit 30 will be described with reference to one of the units UN.

Referring to FIG. 5A, provided is the substrate 100 having the first and second surfaces 100a and 100b facing each other may be provided. In example embodiments, the substrate 100 may be a silicon wafer, a germanium wafer, or a silicon-germanium wafer. The buried layer 111 may be formed to cover the first surface 100a of the substrate 100. The buried layer 111 may be formed of or include a semiconductor material; for example, it may be a silicon layer. The buried layer 111 may be heavily doped to have the first conductivity type. As an example, the buried layer 111 may be an n++ layer.

Referring to FIG. 5B, the epitaxial layer 112 may be formed on the buried layer 111. The epitaxial layer 112 may be a layer grown from a top surface of the buried layer 111 using the buried layer 111 as a seed layer. The epitaxial layer 112 may be formed of or include a semiconductor material. For example, the epitaxial layer 112 may be formed of the same material (e.g., silicon) as that of the buried layer 111. The epitaxial layer 112 may be lightly doped to have the first conductivity type. As an example, the epitaxial layer 112 may be an n−− layer.

The insulating pattern 150 may be formed on the epitaxial layer 112. In example embodiments, the insulating pattern 150 may be formed to have a field oxide structure. For example, the insulating pattern 150 may be formed by a LOCal Oxidation of Silicon (LOCOS) process including partially recessing the top surface of the epitaxial layer 112 and oxidizing the recessed region. Alternatively, although not shown, the insulating pattern 150 may be formed to have a shallow trench isolation (STI) structure. For example, the insulating pattern 150 may be formed using an STI process including forming a trench in the top surface of the epitaxial layer 112 and filling the trench with an insulating (e.g., oxide) layer. The insulating pattern 150 may include a silicon oxide layer. When viewed in plan view, the insulating pattern 150 may have a hollow hexagonal shape. In other words, the insulating pattern 150 may be shaped like a closed polygonal curve; for example, it may have a polygonal doughnut-shaped structure.

Referring to FIG. 5C, the second well 122 and the first doped region 131 may be formed in the first region RG1 of the epitaxial layer 112. The first well 121 may be formed in the epitaxial layer 112 and on the second well 122 and the first doped region 131. Further, the doped plug 140 may be formed in the second region RG2 of the epitaxial layer 112 to be in contact with the buried layer 111. Each of the second well 122, the first doped region 131, the first well 121, and the doped plug 140 may be formed using an impurity injection process. In the impurity injection process, impurities can be injected at a desired depth in the epitaxial layer 112 by controlling a kinetic energy of the impurities. Therefore, there is no need to form the second well 122, the first doped region 131, the first well 121, and the doped plug 140 in a specific order.

The first doped region 131 may be lightly doped to have the first conductivity type. As an example, the first doped region 131 may be of an n− type. The doped plug 140 may be doped to have the first conductivity type. As an example, the doped plug 140 may be of an n type. The first well 121 may be doped to have the second conductivity type. As an example, the first well 121 may be of a p type. The second well 122 may be lightly doped to have the second conductivity type. As an example, the second well 122 may be of a p− type.

Referring back to FIG. 4, the second doped region 132, the third doped region 133, and the fourth doped region 134 may be formed in an upper portion of the first well 121. The fourth doped region 134 may be spaced apart from the third doped region 133 with the insulating pattern 150 interposed therebetween. The lightly-doped region 160 may be formed between the insulating pattern 150 and the fourth doped region 134. In certain embodiments, the fifth doped region 135 may be formed in an upper portion of the doped plug 140. Each of the second to fifth doped regions 132, 133, 134, and 135 and the lightly-doped region 160 may be formed using an impurity injection process, and the order of forming them is not particularly limited.

The second, fourth, and fifth doped regions 132, 134, and 135 may be heavily doped to have the first conductivity type. As an example, the second, fourth, and fifth doped regions 132, 134, and 135 may be n++ regions. The lightly-doped region 160 may be lightly doped to have the first conductivity type. As an example, the lightly-doped region 160 may be an n− region. The third doped region 133 may be heavily doped to have the second conductivity type. As an example, the third doped region 133 may be a p++ region.

The first to fourth contacts 171-174 may be formed on the second to fifth doped regions 132, 133, 134, and 135, respectively. The first to fourth contacts 171-174 may be formed to contain a metallic material. The first contact 171 on the second doped region 132 and the second contact 172 on the third doped region 133 may be connected to the ground terminal 20, and the third contact 173 on the fourth doped region 134 and the fourth contact 174 on the fifth doped region 135 may be connected to the pad 10. The second resistor 92 may be formed between the ground terminal 20 and the second contact 172.

Figure 6:
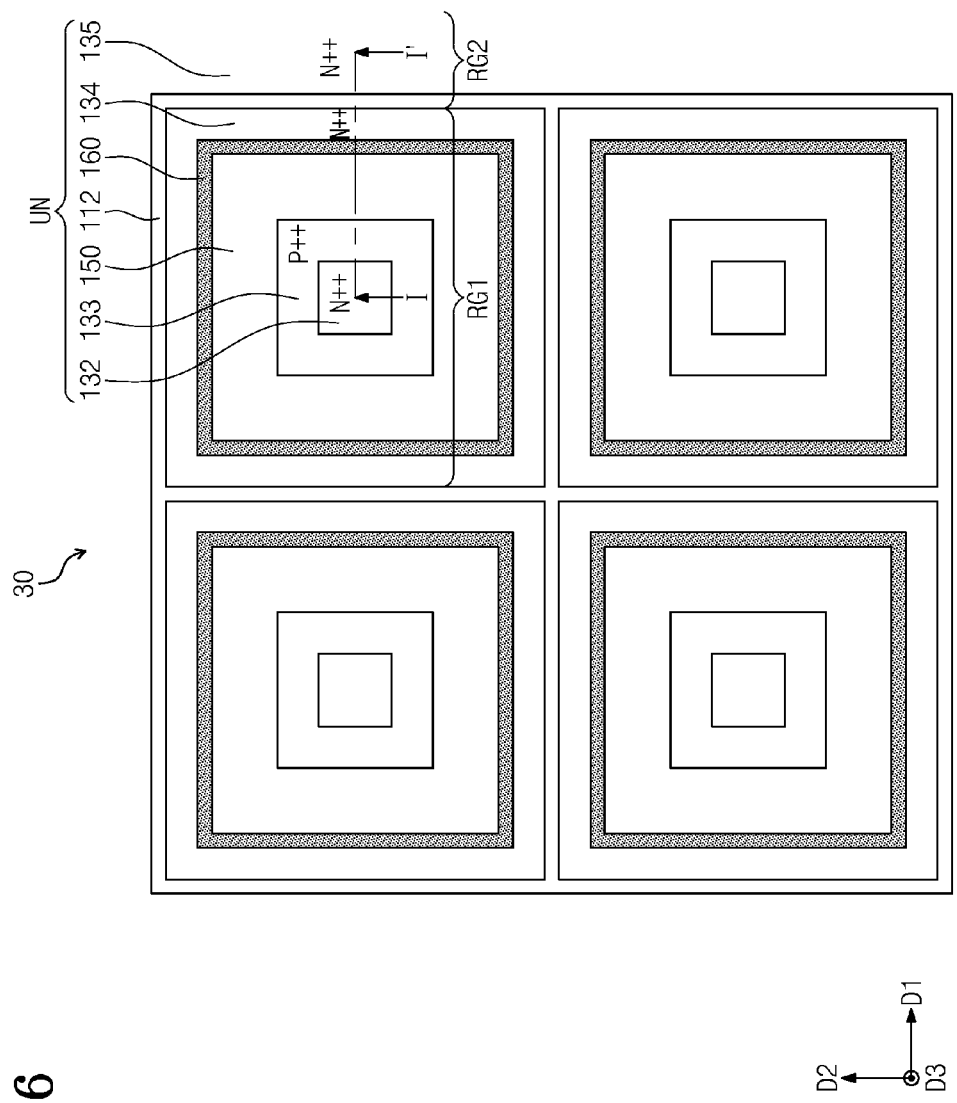
FIG. 6 is a plan view illustrating an ESD circuit according to other example embodiments of the inventive concept.

FIG. 6 is a plan view illustrating an ESD circuit according to other example embodiments of the inventive concept. For concise description, an element previously described with reference to FIGS. 2 through 4 may be identified by a similar or identical reference number without repeating an overlapping description thereof.

When viewed in plan view, the second and third doped regions 132 and 133 serving as the anode 52 may be provided to have a rectangular, square, or tetragonal shape. The insulating pattern 150 may have a hollow rectangular or square shape. In other words, the insulating pattern 150 may be provided to form a closed curve (e.g., shaped like a tetragonal doughnut). When viewed in plan view, the lightly-doped region 160 may be shaped like a tetragonal doughnut enclosing the insulating pattern 150. The fourth doped region 134 serving as the cathode 51 may be spaced apart from the second and third doped regions 132 and 133 with the insulating pattern 150 therebetween. Here, the fourth doped region 134 may be shaped like a tetragonal doughnut shape enclosing the second and third doped regions 132 and 133 and the insulating pattern 150. Accordingly, the unit UN of the ESD circuit 30 can be configured to have an ability to discharge a higher current density.

Although, in the present embodiment, the second and third doped regions 132 and 133 are described to have a tetragonal shape, example embodiments of the inventive concept are not limited thereto. For example, the second and third doped regions 132 and 133 may have any polygonal shape. Meanwhile, for the ESD circuit 30 according to the present embodiment, a vertical section taken along line I-I' of FIG. 6 may be substantially the same as illustrated in FIG. 4.

FIG. 7 is a plan view illustrating an ESD circuit according to still other example embodiments of the inventive concept, and FIG. 8 is a sectional view taken along line I-I' of FIG. 7. For concise description, an element previously described with reference to FIGS. 2 through 4 may be identified by a similar or identical reference number without repeating an overlapping description thereof.

Referring to FIGS. 2, 7, and 8, the fifth doped region 135 of FIGS. 3 and 4 may not be provided in the ESD circuit according to the present embodiment. Instead, the fourth doped region 134 may be laterally extended into the upper portion of the doped plug 140. In other words, the fourth doped region 134 may be provided in both the first and second regions RG1 and RG2 of the epitaxial layer 112. When viewed in plan view, the fourth doped region 134 may be formed to completely enclose the insulating pattern 150 and the lightly-doped region 160.

In the present embodiment, the fourth doped region 134 may serve as not only the first collector 61 of the lateral bipolar transistor 60 but also the second collector 71 of the vertical bipolar transistor 70. In other words, in the case where the vertical bipolar transistor 70 is turned on, electrons can be discharged to the pad 10 through the second doped region 132, the first well 121, the first doped region 131, the epitaxial layer 112, the buried layer 111, the doped plug 140, and the fourth doped region 134.

Figure 9:
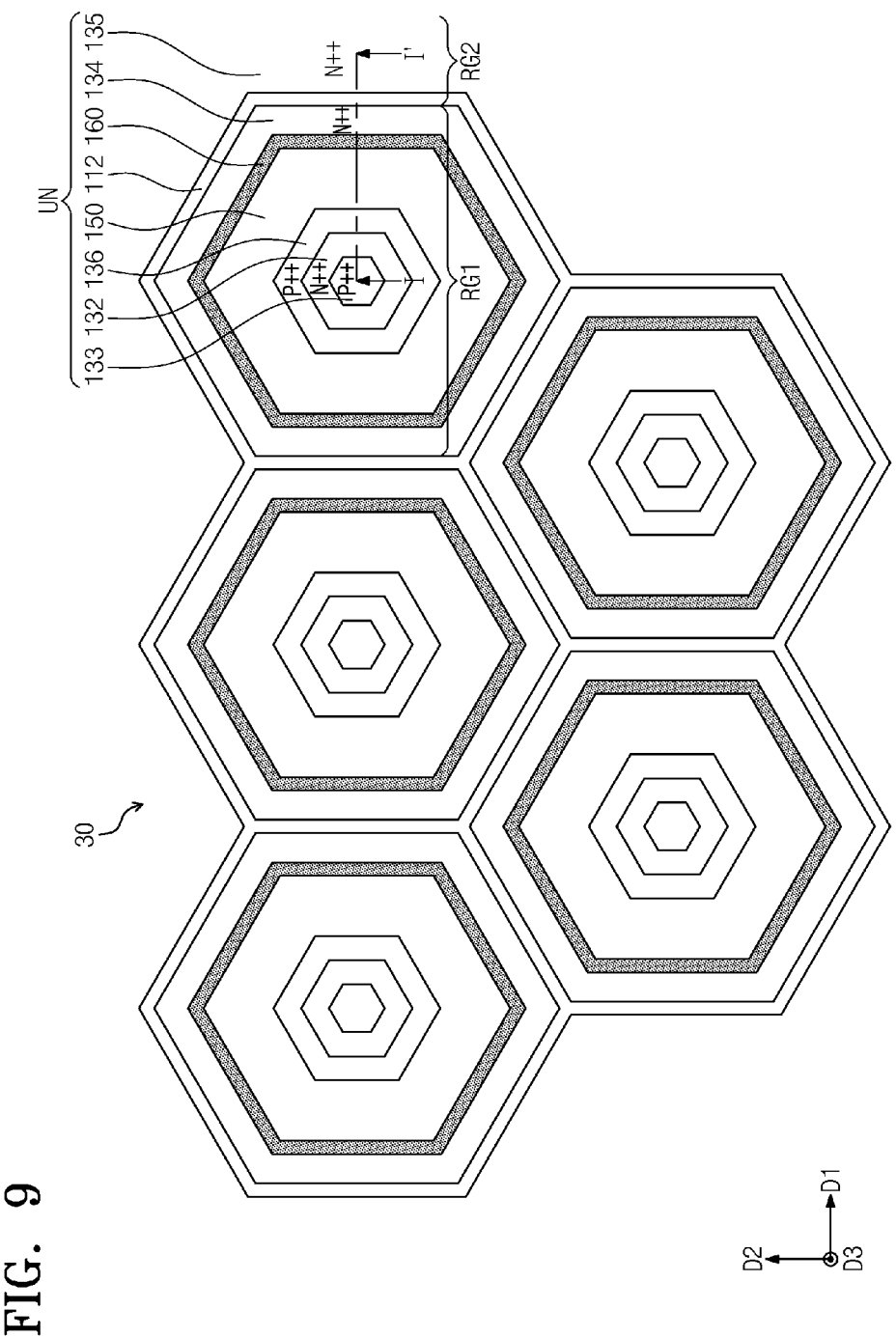
FIG. 9 is a plan view illustrating an ESD circuit according to even other example embodiments of the inventive concept.
Figure 10:
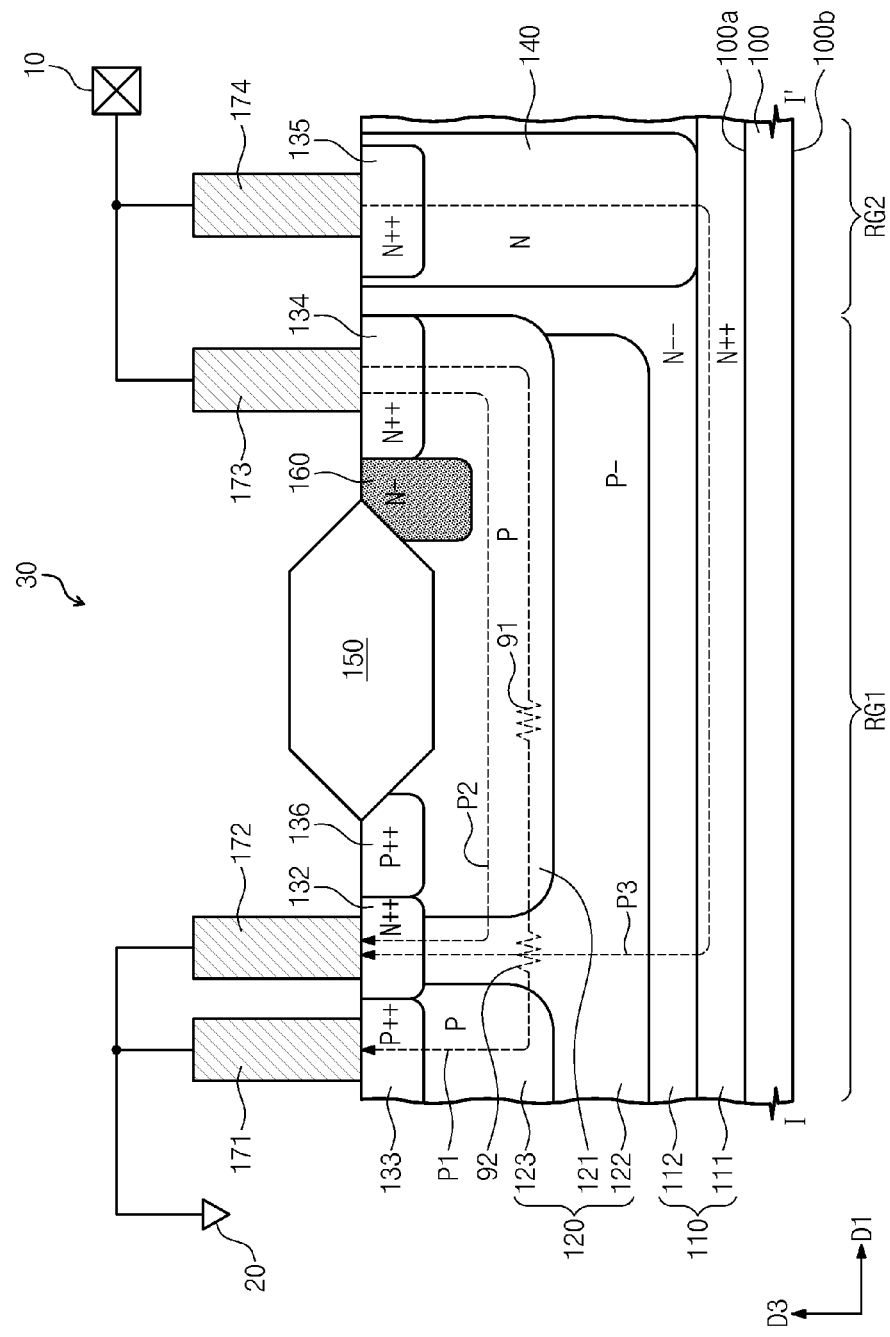
FIG. 10 is a sectional view taken along line I-I' of FIG. 9.

FIG. 9 is a plan view illustrating an ESD circuit according to even other example embodiments of the inventive concept, and FIG. 10 is a sectional view taken along line I-I' of FIG. 9. For concise description, an element previously described with reference to FIGS. 2 through 4 may be identified by a similar or identical reference number without repeating an overlapping description thereof.

Referring to FIGS. 2, 9, and 10, the wells 120 may be provided in the first region RG1 of the epitaxial layer 112. The wells 120 may include first to third wells 121, 122, and 123. The third well 123 may be laterally spaced apart from the first well 121, and the second well 122 may include a portion interposed between the third well 123 and the first well 121. The third well 123 may be formed to have a bottom surface substantially coplanar with the bottom surface of the first well 121. The second well 122 may be in contact with both the bottom surfaces of the third and first wells 123 and 121.

When viewed in plan view, the first well 121 may have a hollow hexagonal shape. For example, the first well 121 may be shaped like a hexagonal doughnut. The second well 122 may also have a hexagonal shape. The third well 123 may be positioned at a central portion of the second well 122 and have a hexagonal shape.

The first doped region 131 of FIG. 4 may not be provided in the ESD circuit according to the present embodiment. The third doped region 133 may be provided in an upper portion of the third well 123. The third doped region 133 may have a bottom surface that is in direct contact with the third well 123. The second doped region 132 may be provided on a region interposed between the third and first wells 123 and 121 to be in direct contact with the second well 122. A sixth doped region 136 may be provided between the second doped region 132 and the insulating pattern 150.

When viewed in plan view, the third doped region 133 may be disposed at a center of an inner region, defined by the insulating pattern 150 shaped like a closed curve, and may have a hexagonal shape. The second doped region 132 may be disposed between the third doped region 133 and the sixth doped region 136. The sixth doped region 136 may be disposed between the second doped region 132 and the insulating pattern 150. For example, the second doped region 132 may be shaped like a doughnut enclosing the third doped region 133, and the sixth doped region 136 may be shaped like a doughnut enclosing the second doped region 132.

The first well 121 and the fourth doped region 134 may make a junction with each other, thereby forming the Zener diode 50. The Zener diode 50 may be operated to discharge holes to the ground terminal 20 through the fourth doped region 134, the first well 121, the second well 122, the third well 123, and the third doped region 133. In other words, the first current path P1 can be formed. Here, a parasitic resistor, i.e., the first resistor 91, may be formed on the first current path P1 including the Zener diode 50. In addition, the second resistor 92 serving as another parasitic resistor may be formed on or in the portion of the second well 122 interposed between the first and third wells 121 and 123.

The second doped region 132, the second well 122, the first well 121, and the fourth doped region 134 may make junctions with one another, thereby forming the lateral bipolar transistor 60. Here, the second doped region 132 may serve as the first emitter 62 of the lateral bipolar transistor 60, the first and second wells 121 and 122 may serve as the first base 63 of the lateral bipolar transistor 60, and the fourth doped region 134 may serve as the first collector 61 of the lateral bipolar transistor 60. In the case where the lateral bipolar transistor 60 is turned on, electrons can be discharged to the pad 10 through the second doped region 132, the second well 122, the first well 121, and the fourth doped region 134. In other words, the second current path P2 can be formed.

The second doped region 132, the second well 122, and the epitaxial layer 112 may make junctions with one another, thereby forming the vertical bipolar transistor 70. Here, the second doped region 132 may serve as the second emitter 72 of the vertical bipolar transistor 70, the second well 122 may serve as the second base 73 of the vertical bipolar transistor 70, and the epitaxial layer 112 may serve as the second collector 71 of the vertical bipolar transistor 70. In the case where the vertical bipolar transistor 70 is turned on, electrons can be discharged to the pad 10 through the second doped region 132, the second well 122, the epitaxial layer 112, the buried layer 111, the doped plug 140, and the fifth doped region 135. In other words, the third current path P3 can be formed.

Figure 11:
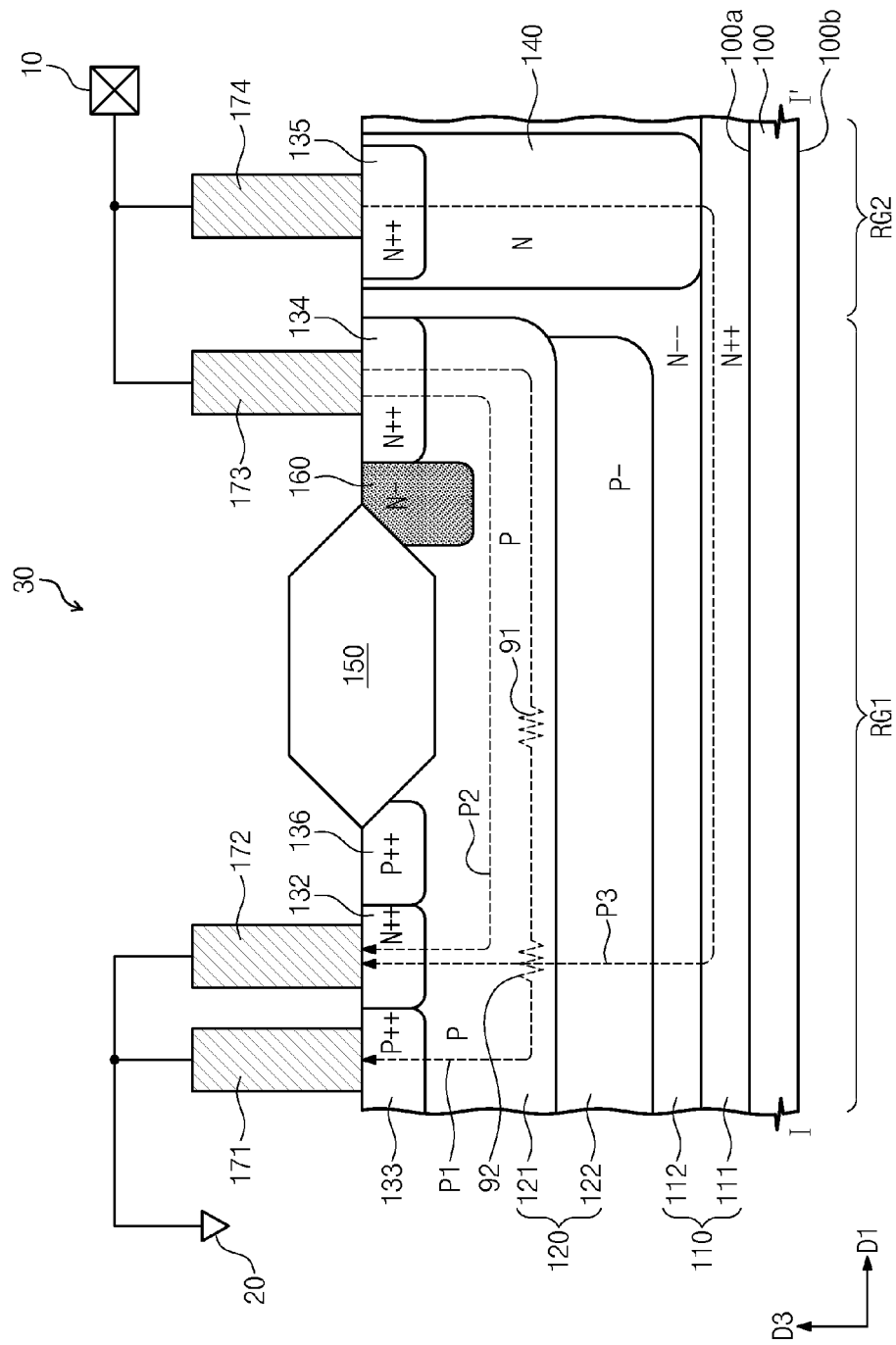
FIG. 11 is a sectional view illustrating an ESD circuit according to yet other example embodiments of the inventive concept, taken in a direction corresponding to that of line I-I' of FIG. 9.

FIG. 11 is a sectional view illustrating an ESD circuit according to yet other example embodiments of the inventive concept, taken in a direction corresponding to that of line I-I' of FIG. 9. For concise description, an element previously described with reference to FIGS. 2, 9 and 10 may be identified by a similar or identical reference number without repeating an overlapping description thereof.

Referring to FIGS. 2, 9, and 11, the wells 120 may be formed in the first region RG1 of the epitaxial layer 112. The wells 120 may include the first and second wells 121 and 122. However, the wells 120 may be configured not to include the third well 123 of FIG. 10. The first well 121 may be extended to be in contact with bottom surfaces of the third doped region 133, the second doped region 132, and the sixth doped region 136. In addition, the first well 121 may be in contact with a top surface of the second well 122. When viewed in a plan view, the first and second wells 121 and 122 may have a hexagonal shape and may be overlapped with each other.

The first well 121 and the fourth doped region 134 may make a junction with each other, thereby forming the Zener diode 50. The Zener diode 50 may be operated to discharge holes to the ground terminal 20 through the fourth doped region 134, the first well 121, and the third doped region 133. In other words, the first current path P1 can be formed. Here, a parasitic resistor, i.e., the first resistor 91, may be formed on the first current path P1 including the Zener diode 50. In addition, the second resistor 92 serving as another parasitic resistor may be formed below the second doped region 132.

The second doped region 132, the first well 121, and the fourth doped region 134 may make junctions with one another, thereby forming the lateral bipolar transistor 60. Here, the second doped region 132 may serve as the first emitter 62 of the lateral bipolar transistor 60, the first well 121 may serve as the first base 63 of the lateral bipolar transistor 60, and the fourth doped region 134 may serve as the first collector 61 of the lateral bipolar transistor 60. In the case where the lateral bipolar transistor 60 is turned on, electrons can be discharged to the pad 10 through the second doped region 132, the first well 121, and the fourth doped region 134. In other words, the second current path P2 can be formed.

The second doped region 132, the first and second wells 121 and 122, and the epitaxial layer 112 may make junctions with one another, thereby forming the vertical bipolar transistor 70. Here, the second doped region 132 may serve as the second emitter 72 of the vertical bipolar transistor 70, the first and second wells 121 and 122 may serve as the second base 73 of the vertical bipolar transistor 70, and the epitaxial layer 112 may serve as the second collector 71 of the vertical bipolar transistor 70. In the case where the vertical bipolar transistor 70 is turned on, electrons can be discharged to the pad 10 through the second doped region 132, the first well 121, the second well 122, the epitaxial layer 112, the buried layer 111, the doped plug 140, and the fifth doped region 135. In other words, the third current path P3 can be formed.

Figure 12:
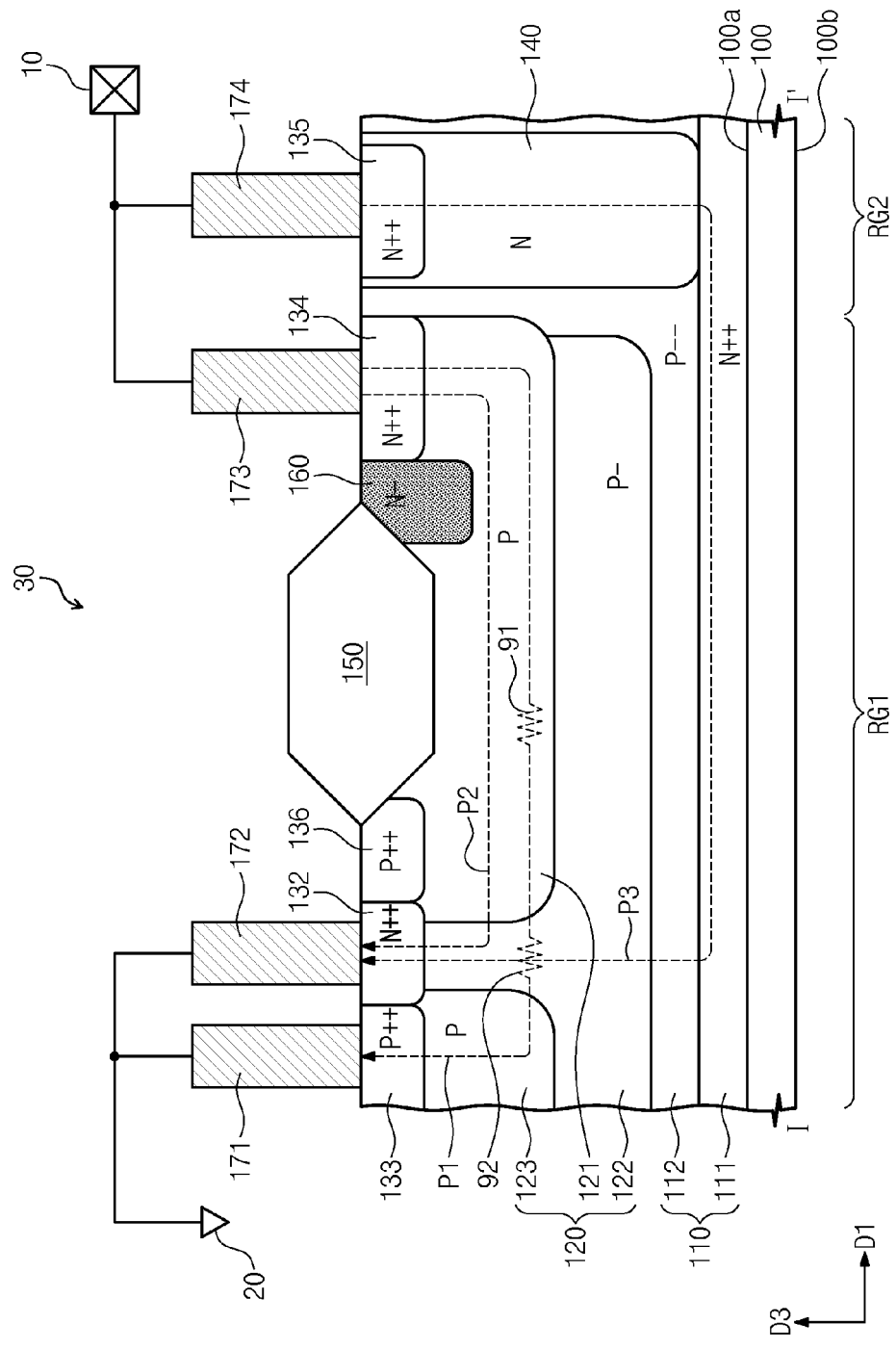
FIG. 12 is a sectional view illustrating an ESD circuit according to further example embodiments of the inventive concept, taken in a direction corresponding to that of line I-I' of FIG. 9.

FIG. 12 is a sectional view illustrating an ESD circuit according to further example embodiments of the inventive concept, taken in a direction corresponding to that of line I-I' of FIG. 9. For concise description, an element previously described with reference to FIGS. 2, 9, and 10 may be identified by a similar or identical reference number without repeating an overlapping description thereof.

Referring to FIGS. 2, 9, and 12, the semiconductor layer 110 may include the buried layer 111 and the epitaxial layer 112 covering the buried layer 111. Here, the epitaxial layer 112 may be lightly doped to have the second conductivity type, which is opposite to or different from that of the buried layer 111. As an example, the buried layer 111 may be of an n++ type, whereas the epitaxial layer 112 may be of a p-- type.

The second doped region 132, second well 122, the epitaxial layer 112, and the buried layer 111 may make junctions with one another, thereby forming the vertical bipolar transistor 70. Here, the second doped region 132 may serve as the second emitter 72 of the vertical bipolar transistor 70, the second well 122 and the epitaxial layer 112 may serve as the second base 73 of the vertical bipolar transistor 70, and the buried layer 111 may serve as the second collector 71 of the vertical bipolar transistor 70. In the case where the vertical bipolar transistor 70 is turned on, electrons may be discharged to the pad 10 through the second doped region 132, the second well 122, the epitaxial layer 112, the buried layer 111, the doped plug 140, and the fifth doped region 135. In other words, the third current path P3 can be formed.

Figure 13:
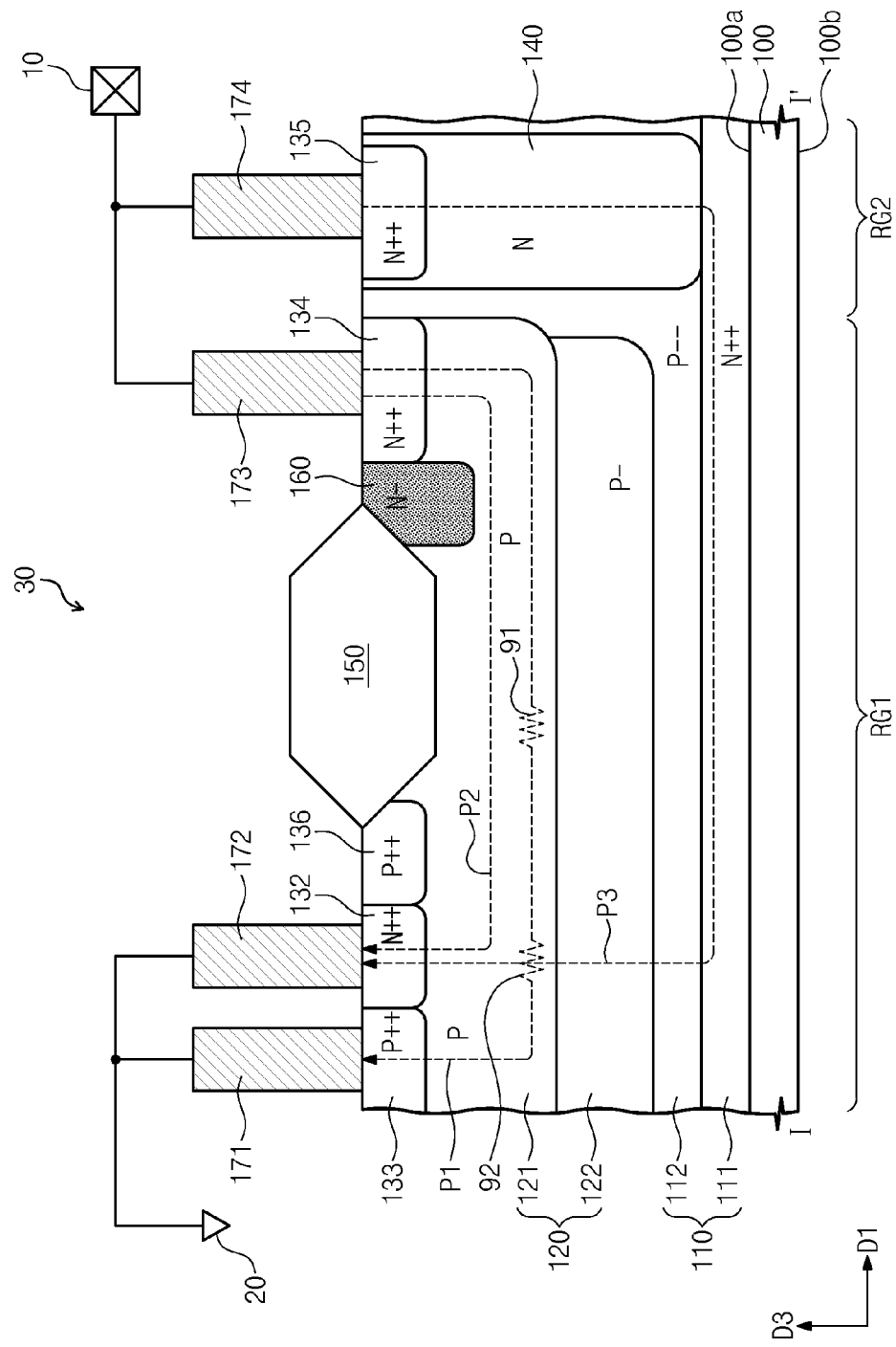
FIG. 13 is a sectional view illustrating an ESD circuit according to still further example embodiments of the inventive concept, taken in a direction corresponding to that of line I-I' of FIG. 9.

FIG. 13 is a sectional view illustrating an ESD circuit according to still further example embodiments of the inventive concept, taken in a direction corresponding to that of line I-I' of FIG. 9. For concise description, an element previously described with reference to FIGS. 2, 9, and 11 may be identified by a similar or identical reference number without repeating an overlapping description thereof.

Referring to FIGS. 2, 9, and 13, the semiconductor layer 110 may include the buried layer 111 and the epitaxial layer 112 covering the buried layer 111. Here, the epitaxial layer 112 may be lightly doped to have the second conductivity type, which is opposite to or different from that of the buried layer 111. As an example, the buried layer 111 may be of an n++ type, whereas the epitaxial layer 112 may be of a p-- type.

The second doped region 132, the first and second wells 121 and 122, the epitaxial layer 112, and the buried layer 111 may make junctions with one another, thereby forming the vertical bipolar transistor 70. Here, the second doped region 132 may serve as the second emitter 72 of the vertical bipolar transistor 70, the first and second wells 121 and 122 and the epitaxial layer 112 may serve as the second base 73 of the vertical bipolar transistor 70, and the buried layer 111 may serve as the second collector 71 of the vertical bipolar transistor 70. In the case where the vertical bipolar transistor 70 is turned on, electrons can be discharged to the pad 10 through the second doped region 132, the first well 121, the second well 122, the epitaxial layer 112, the buried layer 111, doped plug 140, and the fifth doped region 135. In other words, the third current path P3 can be formed.

Figure 14:
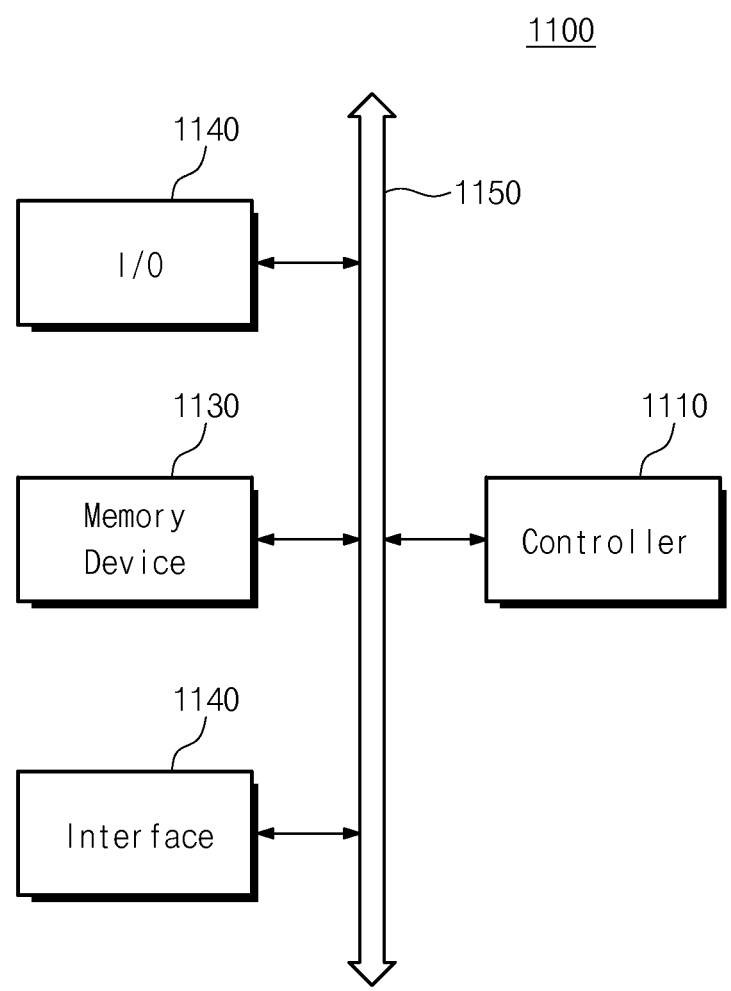
FIG. 14 is a schematic block diagram illustrating an example of electronic systems including a semiconductor device according to example embodiments of the inventive concept.

FIG. 14 is a schematic block diagram illustrating an example of electronic systems including a semiconductor device according to example embodiments of the inventive concept.

Referring to FIG. 14, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or other logic devices. The other logic devices may have a similar function to any one of the microprocessor, the digital signal processor and the microcontroller. The I/O unit 1120 may include a keypad, a keyboard or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110. In certain embodiments, the semiconductor device according to example embodiments of the inventive concept may be provided as a part of the memory device 1130, the controller 1110, and/or the I/O unit 1120.

The electronic system 1100 may be applied to a personal digital assistant (PDA), a portable computer, a web tablet, a wireless phone, a mobile phone, a digital music player, a memory card or an electronic product. The electronic product may receive or transmit information data by wireless.

According to example embodiments of the inventive concept, an ESD protection circuit may have three current paths provided by a Zener diode and two bipolar transistors, and thus it has an ability to discharge a higher current density. Further, when viewed in a plan view, since each unit is configured to have a polygonal shape, the ESD protection circuit can have an improved discharging ability. In other words, the usage of the ESD protection circuit makes it possible to quickly remove an ESD pulse and consequently protect a core circuit part against an ESD event.

While example embodiments of the inventive concepts have been particularly shown and described, it will be understood by one of ordinary skill in the art that variations in form and detail may be made therein without departing from the spirit and scope of the attached claims.

What is claimed is:

1. An electrostatic discharge (ESD) protection circuit, comprising:
    a substrate;
    a semiconductor layer covering a top surface of the substrate and having a first conductivity type;
    at least one well in a first region of the semiconductor layer, each said at least one well having a second conductivity type different from the first conductivity type and extending downwardly from a top surface of the semiconductor layer;
    an insulating pattern extending in an upper portion of the at least one well; and
    a first doped region and a second doped region in the upper portion of the at least one well, the first and second doped regions having the first conductivity type;
    a doped region between the first doped region and the insulating pattern, the doped region having the second conductivity type,
    wherein the first and second doped regions are laterally spaced apart from each other with the insulating pattern interposed therebetween, and
    the at least one well and the second doped region contact each other to constitute a Zener diode, whereby the Zener diode discharges holes to a region outside the circuit through the doped region between the first doped region and the insulating pattern.

2. The ESD protection circuit of claim 1, wherein the at least one well comprises a first well, and the first doped region, the first well, and the semiconductor layer are vertically-stacked to form a vertical bipolar transistor.

3. The ESD protection circuit of claim 2, wherein the first well and the second doped region contact each other to form the Zener diode, and
    the first doped region, the first well, and the second doped region meet at junctions constituting a lateral bipolar transistor.

4. The ESD protection circuit of claim 3, wherein the first well serves as a common base of the vertical and lateral bipolar transistors, and
    the first doped region serves as a common emitter of the vertical and lateral bipolar transistors.

5. The ESD protection circuit of claim 3, wherein the semiconductor layer serves as a collector of the vertical bipolar transistor,
    the second doped region serves as a collector of the lateral bipolar transistor, and
    further comprising an external pad to which collectors are connected in common.

6. The ESD protection circuit of claim 1, wherein the at least one well comprises a first well, and
    further comprising a third doped region having the first conductivity type between the first well and the substrate,
    wherein the third doped region contacts the first well, and when viewed in plan, the first and third doped regions overlap.

7. The ESD protection circuit of claim 6, wherein the first doped region, the first well, and the third doped region meet at junctions constituting a vertical bipolar transistor.

8. The ESD protection circuit of claim 1, wherein the at least one well comprises a first well and a second well extending downwardly from a bottom of the first well, and
    the second well has a doping concentration lower than that of the first well.

9. The ESD protection circuit of claim 1, further comprising:
    a doped plug extending downwardly in the semiconductor layer from the top surface of the semiconductor layer, the doped plug having the first conductivity type; and
    a doped region in an upper portion of the doped plug, and having the first conductivity type at a doping concentration different from that of the doped plug.

10. The ESD protection circuit of claim 9, wherein the at least one well comprises a first well, and the doped plug is laterally spaced apart from the first well.

11. The ESD protection circuit of claim 1, further comprising a doped plug extending in a second region of the semiconductor layer and downwardly from the top surface of the semiconductor layer, the doped plug having the first conductivity type,
    wherein the second doped region extends laterally into an upper portion of the doped plug.

12. The ESD protection circuit of claim 1, further comprising a lightly-doped region between the second doped region and the insulating pattern,
    wherein the lightly-doped region has the first conductivity type, and
    a bottom of the lightly-doped region is lower than that of the second doped region.

13. The ESD protection circuit of claim 1, wherein, when viewed in plan, the insulating pattern has inner and outer boundaries each in the form a closed polygon with four or more vertices, the first doped region is disposed at a central part of region defined by the inner boundary of the insulating pattern, and the second doped region is disposed outside the insulating pattern.

14. An electrostatic discharge (ESD) protection circuit, comprising:

a substrate;

a semiconductor layer having a first conductivity type on the substrate;

a first well in a first region of the semiconductor layer, the first well having a second conductivity type different from the first conductivity type and extending downwardly from a top surface of the semiconductor layer;

an insulating pattern extending in an upper portion of the first well on the first well;

a first doped region and a second doped region in an upper portion of the first well, the first and second doped regions having the first conductivity type and being laterally spaced apart from each other with the insulating pattern interposed therebetween;

a third doped region spaced apart from the insulating pattern with the first doped region therebetween; and a fourth doped region interposed between the first doped region and the insulating pattern, wherein the third and fourth doped regions have the second conductivity type, and wherein the first well and the second doped region contact with each other to form a Zener diode capable of discharging holes through the third doped region.

15. The ESD protection circuit of claim 14, further comprising:

a third well laterally spaced apart from the first well to have the second conductivity type; and a second well having the second conductivity type extended downwardly from bottom surfaces of the first and third wells, wherein, the first well makes a junction with the fourth doped region, the second well makes a junction with the first doped region, and the third well makes a junction with the third doped region, and wherein the first and third wells have doping concentrations higher than that of the second well.

16. The ESD protection circuit of claim 14, wherein the semiconductor layer comprises:

a buried layer of the first conductivity type; and an epitaxial layer having the second conductivity type on the buried layer, and the first doped region, the epitaxial layer, and the buried layer are vertically-stacked to form a vertical bipolar transistor.

17. An electrostatic discharge protection (ESD) circuit, comprising:

a Zener diode;

a lateral bipolar transistor having a collector; and a vertical bipolar transistor having a collector, wherein the lateral bipolar transistor and the vertical bipolar transistor have a common emitter and a common base, the common emitter and the common base are regions of material, respectively, having conductivity types different from each other, wherein the collector of the lateral bipolar transistor and the collector of the vertical bipolar transistor have the same conductivity type as the common emitter of the lateral and vertical bipolar transistors, and wherein the collector and the base of the lateral bipolar transistor constitutes the Zener diode.

18. The ESD circuit of claim 17, wherein the emitter of the lateral bipolar transistor is electrically connected to a ground terminal applied with a ground voltage, the collectors of the lateral and vertical bipolar transistors are connected in common to a pad serving as an input/output terminal.

19. The ESD protection circuit of claim 17, wherein the Zener diode is configured to turn on the lateral and vertical bipolar transistors, when an ESD event occurs, and the first well is electrically connected to a first terminal, to which a ground voltage is applied.

* * * * *